United States Patent
Avci et al.

(10) Patent No.: US 9,871,106 B2
(45) Date of Patent: Jan. 16, 2018

(54) HETEROGENEOUS POCKET FOR TUNNELING FIELD EFFECT TRANSISTORS (TFETS)

(71) Applicant: Intel Corporation, Santa Clara, CA (US)

(72) Inventors: Uygar E. Avci, Portland, OR (US); Roza Kotlyar, Portland, OR (US); Gilbert Dewey, Hillsboro, OR (US); Benjamin Chu-Kung, Hillsboro, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/037,296

(22) PCT Filed: Dec. 23, 2013

(86) PCT No.: PCT/US2013/077604
§ 371 (c)(1),
(2) Date: May 17, 2016

(87) PCT Pub. No.: WO2015/099686
PCT Pub. Date: Jul. 2, 2015

(65) Prior Publication Data
US 2016/0276440 A1    Sep. 22, 2016

(51) Int. Cl.
*H01L 29/76* (2006.01)
*H01L 29/12* (2006.01)
(Continued)

(52) U.S. Cl.
CPC .............. *H01L 29/125* (2013.01); *G11C 5/06* (2013.01); *H01L 29/0669* (2013.01);
(Continued)

(58) Field of Classification Search
CPC .... H01L 29/165; H01L 29/78; H01L 29/0895
(Continued)

(56) References Cited

U.S. PATENT DOCUMENTS 8,384,122 B1 * 2/2013 Hu ................ H01L 29/7391
257/104
9,159,565 B2 * 10/2015 Tan ................ H01L 21/26586
(Continued)

FOREIGN PATENT DOCUMENTS

CN    102664192 A    9/2012
KR    10-2008-0006268 A    1/2008

OTHER PUBLICATIONS

Notification of Transmittal of the International Search Report and the Written Opinion of the International Searching Authority for PCT/US2013/077604 filed Dec. 23, 2013, dated Sep. 23, 2014, 9 pages.
(Continued)

*Primary Examiner* — David Vu
*Assistant Examiner* — Brandon Fox
(74) *Attorney, Agent, or Firm* — Schwabe, Williamson & Wyatt P.C.

(57) ABSTRACT

Embodiments of the disclosure described herein comprise a tunneling field effect transistor (TFET) having a drain region, a source region having a conductivity type opposite of the drain region, a channel region disposed between the source region and the drain region, a gate disposed over the channel region, and a heterogeneous pocket disposed near a junction of the source region and the channel region. The heterogeneous pocket comprises a semiconductor material different than the channel region, and comprises a tunneling barrier less than the bandgap in the channel region and forming a quantum well in the channel region to in crease a (Continued)

current through the TFET transistor when a voltage applied to the gate is above a threshold voltage.

20 Claims, 5 Drawing Sheets

(51) Int. Cl.
    *H01L 29/739* (2006.01)
    *G11C 5/06* (2006.01)
    *H01L 29/06* (2006.01)
    *H01L 29/165* (2006.01)
    *H01L 29/205* (2006.01)
    *H01L 29/78* (2006.01)

(52) U.S. Cl.
    CPC .......... *H01L 29/165* (2013.01); *H01L 29/205* (2013.01); *H01L 29/7391* (2013.01); *H01L 29/7831* (2013.01)

(58) Field of Classification Search
    USPC ........................................................ 257/213
    See application file for complete search history.

(56) References Cited

U.S. PATENT DOCUMENTS

| | | | |
|---|---|---|---|
| 9,171,944 B2 * | 10/2015 | Huang | H01L 29/66325 |
| 2010/0059737 A1 * | 3/2010 | Bhuwalka | H01L 29/7391 257/28 |
| 2010/0295058 A1 | 11/2010 | Cho | |
| 2011/0084319 A1 * | 4/2011 | Zhu | B82Y 10/00 257/288 |
| 2011/0215425 A1 * | 9/2011 | Loh | H01L 29/78 257/410 |
| 2012/0146126 A1 | 6/2012 | Lai et al. | |
| 2012/0223318 A1 | 9/2012 | Toh et al. | |
| 2015/0001594 A1 * | 1/2015 | Liu | H01L 29/66477 257/288 |
| 2015/0108432 A1 * | 4/2015 | Toh | H01L 29/785 257/29 |
| 2017/0054006 A1 * | 2/2017 | Avci | H01L 29/66356 |

OTHER PUBLICATIONS

Notification Concerning of Transmittal of the International Preliminary Report on Patentability of the International Searching Authority for PCT/US2013/077604 filed Dec. 23, 2013, dated Jul. 7, 2016, 6 pages.

Communication from the European Patent Office for European Patent Application No. 13900282.8-1552, PCT/US2013/077604 dated Jul. 29, 2016, 6 pages.

* cited by examiner

HETEROGENEOUS POCKET FOR TUNNELING FIELD EFFECT TRANSISTORS (TFETS)

This patent application is a U.S. National Phase Application under 35 U.S.C. 371 of International Application No. PCT/US2013/077604 filed Dec. 23, 2013.

TECHNICAL FIELD

Embodiments of the disclosure are in the field of semiconductor packages and, in particular, to heterogeneous pocket designs for tunneling field effect transistors (TFETs).

BACKGROUND

As the size of transistors in integrated circuits (ICs) continues to decrease, the power supply voltage to the transistors and capacitance of the transistors also decrease. As the power supply voltage decreases, the threshold voltage of the transistors in the ICs must also decrease.

Lower threshold voltages are difficult to obtain in conventional metal-oxide-semiconductor field-effect transistors (MOSFETs) because, as the threshold voltage is reduced, the ratio of on-current to off-current ($I_{on}/I_{off}$) also decreases. The on-current refers to the current through a MOSFET when a gate voltage applied is above the threshold voltage, and the off-current refers to current through a MOSFET when a gate voltage applied is below the threshold voltage.

BRIEF DESCRIPTION OF THE DRAWINGS

Non-limiting and non-exhaustive embodiments of the disclosure are described with reference to the following figures, wherein like reference numerals refer to like parts throughout the various views unless otherwise specified.

DESCRIPTION OF THE EMBODIMENTS

Embodiments of the invention describe heterogeneous pocket designs for tunneling field effect transistors (TFETs). In the following description, numerous specific details are set forth, such as packaging architectures, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

Figure 1:
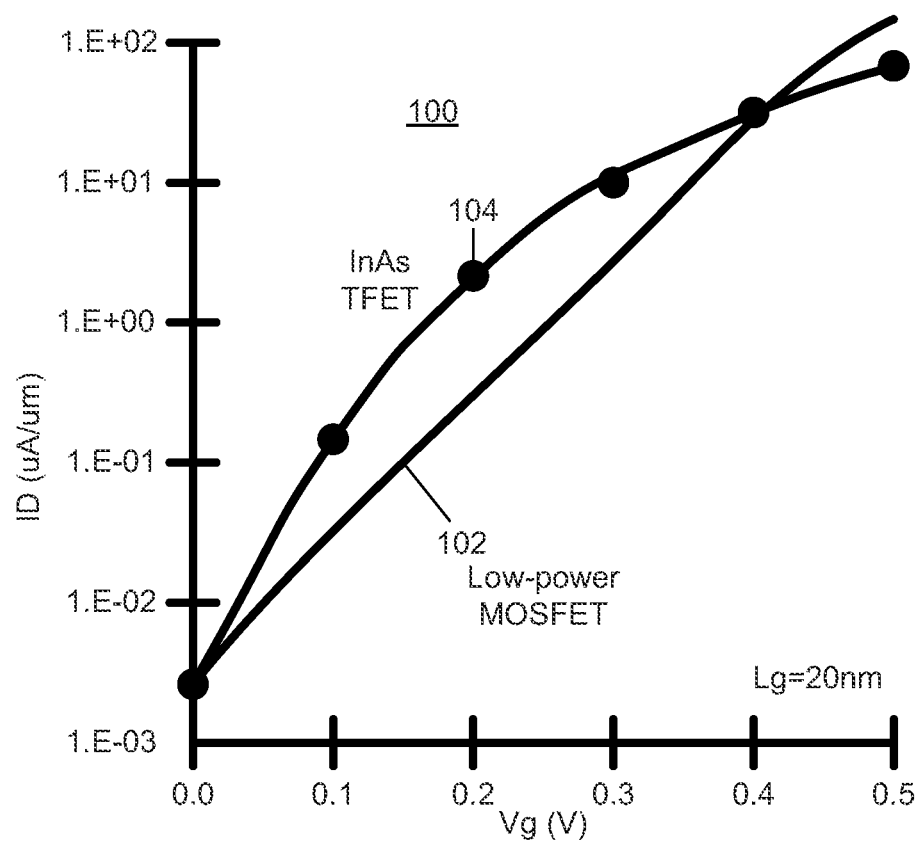
FIG. 1 is a graph illustrating voltage/drain current curves for transistors according to an embodiment of the disclosure.

FIG. 1 is a graph illustrating voltage/drain current curves for transistors according to an embodiment of the disclosure. In this embodiment, graph 100 comprises an x-axis of gate voltage values, and a y-axis of drain current values (normalized to channel width). Curve 102 represents the voltage/current characteristics of a metal-oxide-semiconductor field-effect transistor (MOSFET), while curve 104 represents the voltage/current characteristics of a TFET.

Lower threshold voltages are difficult to obtain in conventional MOSFETs because, as the threshold voltage is reduced, the ratio of on-current to off-current ($I_{on}/I_{off}$) also decreases. As referred to herein, $I_{on}$ refers to the current through a transistor when a gate voltage applied is above the threshold voltage, and $I_{off}$ refers to current through a transistor when a gate voltage applied is below the threshold voltage.

A MOSFET's sub-threshold slope (i.e., rate of increase of current from $I_{off}$ to $I_{on}$ and defined as SS=1e3/[d log 10(I)/dV$_g$]) has a theoretical limit of 60 mV/dec at room temperature, meaning that the supply voltage cannot be significantly reduced while maintaining the high $I_{on}/I_{off}$ ratio. Any target $I_{off}$ value is determined by the transistor's standby power requirement; for example, a transistor having a theoretical sub-threshold slope of zero would be able to operate at very low applied voltage giving a low standby power. $I_{off}$ values are important parameters for low-power standby applications (e.g., mobile computing devices).

Furthermore, for low active-power applications, it is very favorable to operate at lower supply voltages because of the active-power's strong dependence on supply voltage; however, due to the MOSFET sub-threshold slope limit of 60 mv/dec, when these transistors are operated at low supply voltages, $I_{on}$ is significantly low because it may be operating close to the threshold-voltage. In FIG. 1, curve 102 is shown to have a relatively low current rise, wherein about 0.5 volts is needed to switch to $I_{on}$.

Figure 2:
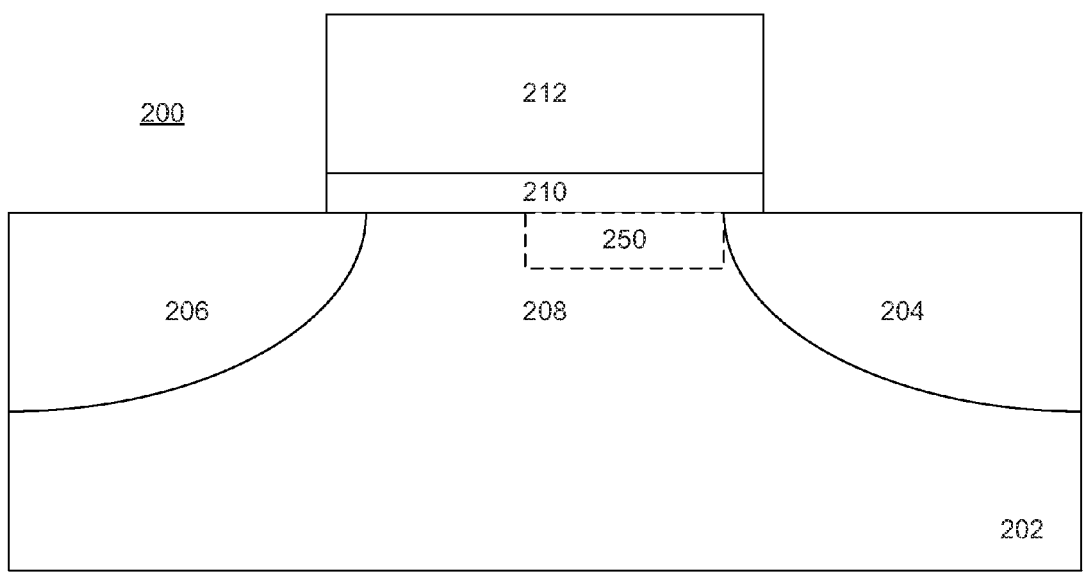
FIG. 2 is an illustration of a tunneling field effect transistor having a resonant pocket of heterogeneous material according to an embodiment of the disclosure.

TFETs may achieve sharper turn-on behavior (i.e., a lower sub threshold-slope) and improved $I_{on}/I_{off}$ ratios compared to MOSFETs. FIG. 2 is an illustration of a TFET having a resonant pocket of heterogeneous material according to an embodiment of the disclosure.

In this embodiment, TFET 200 is shown to be fabricated on semiconductor substrate 202; said semiconductor substrate may comprise any suitable semiconductor material—for example, silicon (Si), germanium (Ge), silicon germanium (SiGe), indium arsenide (InAs), silicon germanium (Sin), germanium tin (GeSn), silicon germanium tin (SiGeSn), or any other III-V or II-VI compound semiconductors.

Substrate 202 may be doped, undoped or contain both doped and undoped regions therein. Substrate 202 may also include one or more doped (n- or p-) regions; if it includes multiple doped regions, these regions may be the same, or they may have different conductivities and/or doping concentrations. These doped regions are known as "wells" and may be used to define various device regions.

In this embodiment, TFET 200 is shown to include source region 204, drain region 206, channel region 208 located between the source and drain regions, and a gate stack disposed over the channel region comprising gate dielectric 210 and gate conductor 210. TFET 200 may comprise an n-channel TFET or a p-channel TFET (for example, in an n-channel TFET, source region 204 may comprise a semiconductor material that is doped with an p-type dopant species, drain region 206 may comprise a semiconductor material that is doped with an n-type dopant species). In all embodiments, the drain region and the source region are doped with opposite carriers. For example, the drain region may be an n-doped region and the source region may be a p-doped region for nTFET, and the drain region may be an p-doped region and the source region may be a n-doped region for pTFET. The channel region 208 can be doped, lightly doped or updoped for optimum performance. A gate voltage above the threshold voltage applied to the gate stack switches the TFET from an off-state to an on-state.

Tunneling occurs when an electron passes through a potential barrier at the source/channel junction which is modulated by the applied gate voltage. When the gate voltage is 0, the potential barrier at the source/channel junction is wide and the tunneling is suppressed giving a low $I_{off}$ current. When the gate voltage is high, the potential barrier narrows, and the tunneling current is high giving Ion current, and high $I_{on}/I_{off}$ ratio. This provides for a lower sub-threshold slope, which allows lower operating voltages to be used. In this embodiment, electrons tunnel from valence band to conduction band at the source/channel junction for nTFET, where they readily transport to drain region 206. In this embodiment, holes tunnel from conduction band to valence band at the source/channel junction for pTFET, where they readily transport to drain region 206. The potential barrier depends on the energy separation between the valence (conduction) band at the source and conduction (valence) band in the channel for nTFET (pTFET). This band separation (which is a tunneling barrier) in a TFET comprising of homogenous material is a bandgap of that material.

Thus, TFETs enable higher $I_{on}$ values compared to MOSFETs at low supply-voltages. Referring back to FIG. 1, curve 104 illustrates the voltage/current characteristics of an InAs TFET, which is shown to achieve a sharper turn-on behavior (i.e., a lower sub-threshold slope) compared to MOSFET curve 102. However, as shown in FIG. 1, curve 104 levels off when the voltage is higher than 0.3 volts. Referring back to FIG. 2, this curve is dependent upon the bandgap between source 204 and channel 208.

To further enhance the tunneling current of TFET 200, resonant pocket of heterogeneous material 250 is provided at the source/channel junction of the TFET device. Pocket 250 may comprise any semiconductor material that has a different band gap than the semiconductor material used for the other components of TFET 200, such as gallium antimonide (GaSb) or InAs. The bandgap of pocket 250 is selected such that the tunneling barrier is lowered in heterogeneous device as compared to homogenous device.

As discussed in further detail below, the dimensions of pocket 250 are selected to further enhance the junction current of TFET 200 (i e, enhance the tunneling current in channel 208) so that the transistor has low $I_{off}$ and high $I_{on}$ values. $I_{off}$ is determined by the bandgap of the device—i.e., the bigger the bandgap, the lower the $I_{off}$; however, a high bandgap also decreases the L. Thus, in this embodiment the body of TFET 200 is configured to have a high bandgap, while pocket 250 creates a low bandgap at the source/channel junction for low tunneling barrier.

Figure 3B:
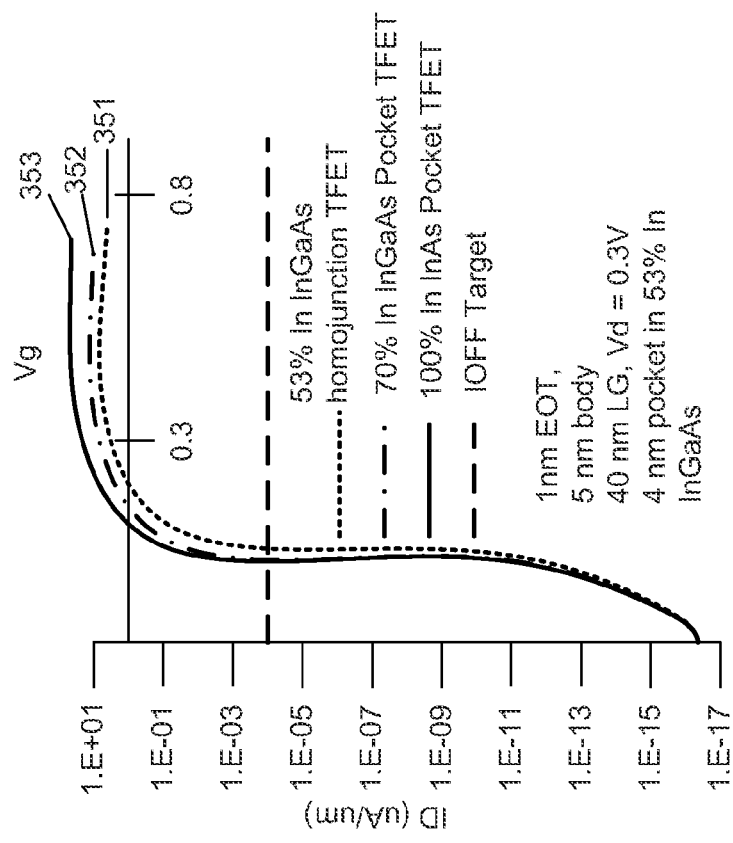
FIG. 3B is a graph illustrating voltage/drain current curves for various tunneling field effect transistors according to embodiments of the disclosure.
Figure 3A:
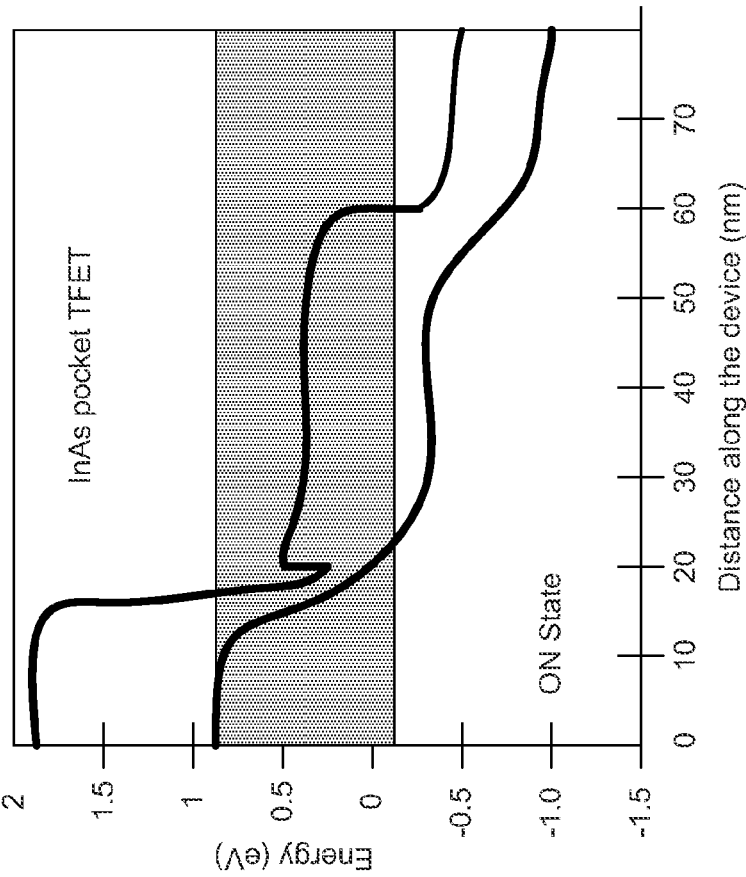
FIG. 3A is a graph illustrating the bandgap behavior of a tunneling field effect transistor according to an embodiment of the disclosure.

FIG. 3A is a graph illustrating the bandgap behavior of a TFET according to an embodiment of the disclosure. In this embodiment, graph 300 illustrates how an InAs pocket TFET lowers the effective tunneling barrier of the transistor, thereby increasing the drive current. In this graph, the x-axis represents the distance along the device (in nm) and the y-axis represents the corresponding bandgap energy (eV).

In the OFF state, there is a wide potential barrier between the source and the channel of the TFET, and as a result, no tunneling occurs. When the gate voltage exceeds the threshold voltage, the potential barrier between the source and the channel of the TFET becomes narrow enough to allow a significant tunneling current (i.e., switching to the ON state).

As shown in graph 300, for an InAs pocket, the bandgap energy (eV, shown as the y-axis) is reduced at source/pocket location at 20 nm; outside the pocket, bandgap may be the same or even larger than in a homogenous TFET. The pocket creates a quantum well for carriers in the direction of transport. The carriers do not transmit through this quantum well equally at all energies. There are the optimum energies for which the transmission could be enhanced (or be resonant). Therefore, implementing a pocket of heterogeneous material in a TFET without understanding resonance level effects would result in inaccurate device targeting (i.e., the pocket material may exhibit the same or worse behavior than conventional homojunction TFETs). In embodiments described herein, the confinement of the TFET transistor body and the pocket size of the heterogeneous material may be configured to optimize energy level of the resonant state to deliver improved TFET transistor characteristics. Once physics behind the degradation are understood, the device may be designed to deliver better transistor characteristics, using resonance of the pocket and the body confinement.

FIG. 3B is a graph illustrating voltage/drain current curves for various TFETs according to embodiments of the disclosure. In this embodiment, curve 351 illustrates voltage/current characteristics of an example homogenous TFET, curve 352 illustrates voltage/current characteristics of an example TFET comprising a pocket comprising 70% heterogeneous material, and curve 353 illustrates voltage/current characteristics of an example TFET comprising a pocket of 100% heterogeneous material. As shown in this figure, curve 352 reaches its peak current (i.e., $I_{on}$ value) faster than the other curves, illustrating that the TFET utilizing a pocket with the most heterogeneous material shrinks the bandgap the most.

Theoretically, a pocket region with smaller bandgap results in increased tunneling current irrelevant of the pocket size and pocket energy-depth; however, this direct relationship breaks down at short gate-lengths with confined body dimensions. As devices and gate lengths are scaled down to increase transistor density, the leakage current is increased, and the device performance is degraded, due to increased short channel effects.

Furthermore, in embodiments where the heterogeneous pocket is narrowed, it forms a quantum well. Electrons in the conduction band of a quantum well are confined to discrete energy states that are determined by quantum mechanical conditions known in the art. Similarly, holes in the valence band of a quantum well are also confined to discrete energy states. When the energy of an electron in the drain region of a TFET aligns with such a discrete energy state of the gate region, the electron tunnels through the quantum well. This alignment may be referred to as a "resonance condition" for the quantum well. Thus, for heterogeneous pockets, the width of the pocket may be chosen to increase the probability of aligning energy states; however if the pocket is too large, it behaves similar to the body of the transistor and degrades the $I_{on}$ levels.

Figure 4:
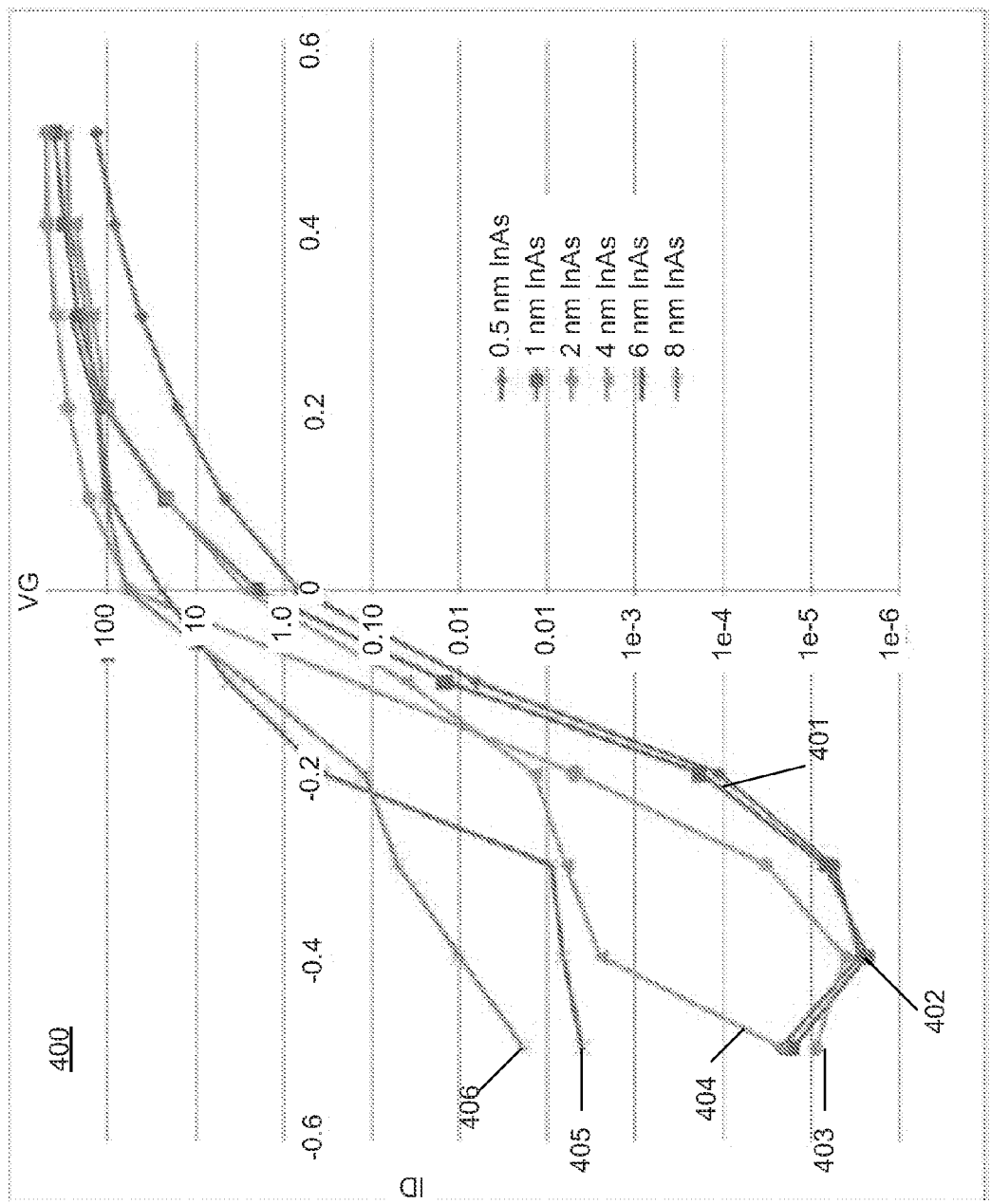
FIG. 4 is a graph illustrating voltage/drain current curves for various tunneling field effect transistors having heterogeneous pockets according to embodiments of the disclosure.

FIG. 4 is a graph illustrating voltage/drain current curves for various TFETs according to embodiments of the disclosure. Graph 400 illustrates several curves for various pocket widths. In this example, curves 601-606 are voltage/drain current curves for increasing pocket widths (i.e., curve 601 corresponds to a TFET with a heterogeneous pocket width of 0.5 nm, curve 602 corresponds to a pocket width of 1 nm, curve 603 corresponds to a pocket width of 2 nm, curve 604 corresponds to a pocket width of 4 nm, curve 605 corresponds to a pocket width of 6 nm, and curve 606 corresponds to a pocket width of 8 nm).

If the design of the TFET body, the heterogeneous pocket dimensions and the material of the heterogeneous pocket are not optimal, the pocket produces an unfavorable TFET I-V curve. As shown in this figure, curve 603 comprises better device conduction during the on-region compared to curves 601 and 602. Larger heterogeneous pockets, such as those corresponding to curves 604-606, provide discrete energy states that help device conduction during on-region, but also adversely affect the device conduction during the off-state. Thus, for this example, the pocket dimensions for curve 602 may be selected. This example is not meant to limit heterogeneous pocket dimensions in embodiments of the disclosure, but to illustrate an example process for determining an optimal design of the TFET body and the heterogeneous pocket dimensions, in addition to the material of the heterogeneous pocket.

Thus, embodiments describe designing a heterogeneous pocket disposed near a junction of the source region and the channel region of a TFET: the heterogeneous pocket comprises a semiconductor material different than the channel region, and wherein the heterogeneous pocket is designed to comprise a lower tunneling barrier and forms a quantum well in the channel region to increase a current through the TFET transistor when a voltage applied to the gate is above a threshold voltage.

Figure 5:
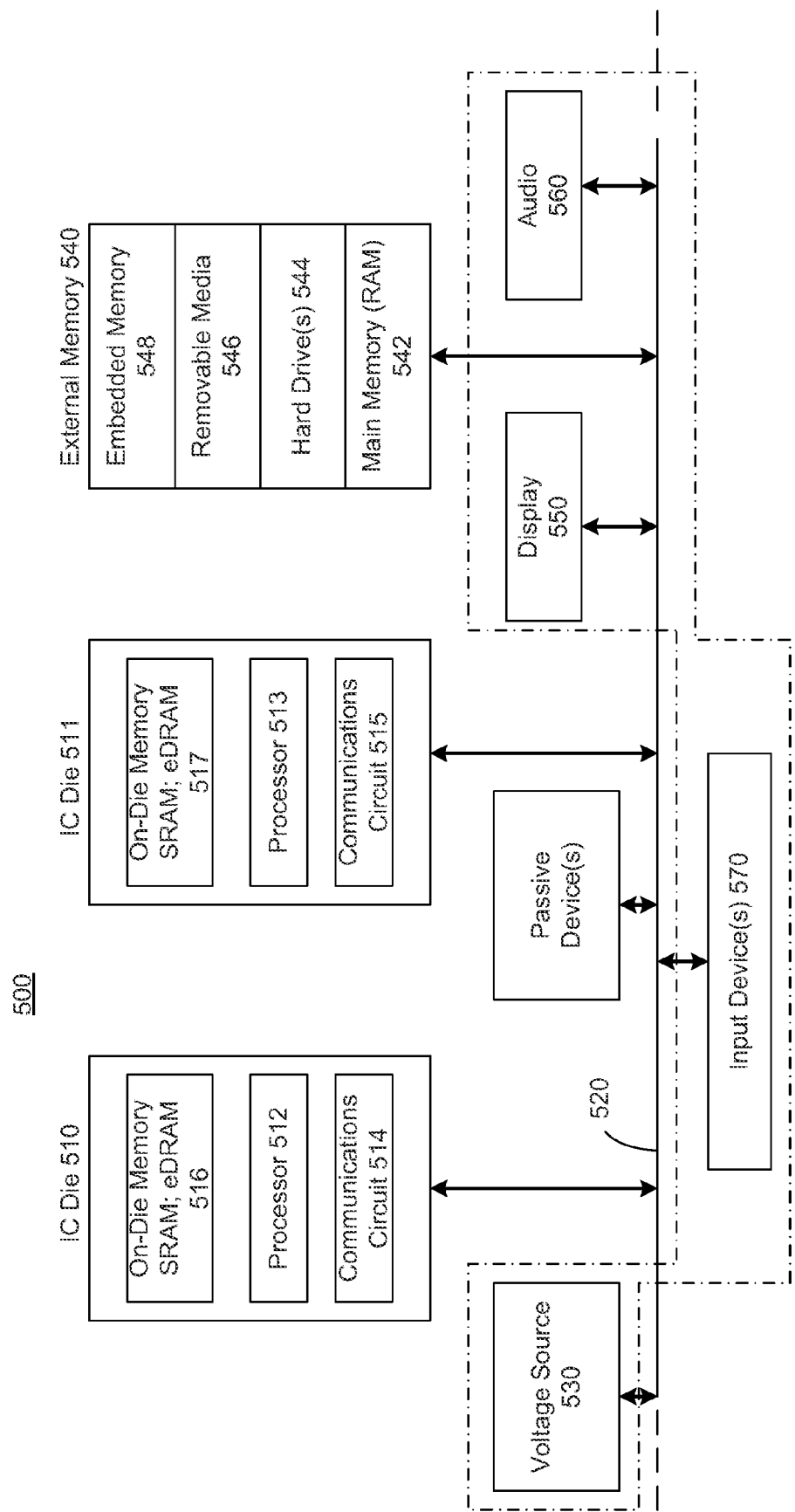
FIG. 5 is an illustration of a computer system to utilize an embodiment of the invention.

FIG. 5 is an illustration of a computer system to utilize an embodiment of the invention. Computer system 500 (also referred to as the electronic system 500) as depicted may comprise components including any of the TFETs including heterogeneous pockets described above. Computer system 500 may be a mobile device such as a netbook computer. Computer system 500 may be a mobile device such as a wireless smart phone. Computer system 500 may be a desktop computer. The computer system 500 may be a hand-held reader. Computer system 500 may be a wearable computing device.

In an embodiment, system 500 is a computer system that includes system bus 520 to electrically couple the various components of the electronic system. System bus 520 is a single bus or any combination of busses according to various embodiments. System 500 includes voltage source 530 that provides power to integrated circuit 510. In some embodiments, the source 530 supplies current to integrated circuit 510 through system bus 520.

Integrated circuit 510 is electrically coupled to system bus 520 and includes any circuit, or combination of circuits according to an embodiment. In an embodiment, integrated circuit 510 includes processor 512 that can be of any type. As used herein, processor 512 may mean any type of circuit such as, but not limited to, a microprocessor, a microcontroller, a graphics processor, a digital signal processor, or another processor. In an embodiment, SRAM embodiments are found in memory caches of the processor. Other types of circuits that can be included in integrated circuit 510 are a custom circuit or an application-specific integrated circuit (ASIC), such as communications circuit 514 for use in wireless devices such as cellular telephones, smart phones, pagers, portable computers, two-way radios, and similar electronic systems. In an embodiment, processor 510 includes on-die memory 516 such as static random-access memory (SRAM). In an embodiment, processor 510 includes embedded on-die memory 516 such as embedded dynamic random-access memory (eDRAM).

In an embodiment, integrated circuit 510 is complemented with subsequent integrated circuit 511. Useful embodiments include dual processor 513 and dual communications circuit 515 and dual on-die memory 517 such as SRAM. In an embodiment, dual integrated circuit 511 includes embedded on-die memory 517 such as eDRAM.

In an embodiment, electronic system 500 also includes an external memory 540 that in turn may include one or more memory elements suitable to the particular application, such as main memory 542 in the form of RAM, one or more hard drives 544, and/or one or more drives that handle removable media 546, such as diskettes, compact disks (CDs), digital variable disks (DVDs), flash memory drives, and other removable media known in the art. External memory 540 may also be embedded memory 548 such as the first die in an embedded TSV die stack, according to an embodiment.

In an embodiment, electronic system 500 also includes display device 550 and audio output 560. In an embodiment, electronic system 500 includes an input device such as controller 570 that may be a keyboard, mouse, trackball, game controller, microphone, voice-recognition device, or any other input device that inputs information into electronic system 500. In an embodiment, input device 570 is a camera. In an embodiment, input device 570 is a digital sound recorder. In an embodiment, input device 570 is a camera and a digital sound recorder.

As shown herein, integrated circuit 510 may be implemented in a number of different embodiments, including a semiconductor package having transistors comprising TFETs including heterogeneous pockets according to any of the several disclosed embodiments and their equivalents, an electronic system, a computer system, one or more methods of fabricating an integrated circuit, and one or more methods of fabricating an electronic assembly that includes a semiconductor package having package having transistors comprising TFETs including heterogeneous pockets according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed semiconductor package having transistors comprising any of the previously discussed TFETs including heterogeneous pockets and their equivalents. A foundation substrate may be included, as represented by the dashed line of FIG. 5. Passive devices 580 may also be included, as is also depicted in FIG. 5.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

It should also be appreciated that reference throughout this specification to "one embodiment," "an embodiment," "one or more embodiments," or "different embodiments," for example, means that a particular feature may be included in the practice of the invention. Similarly, it should be appreciated that in the description various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

Embodiments of the invention thus describe a tunneling field effect transistor (TFET) comprising a drain region, a source region having a conductivity type opposite of the drain region, a channel region disposed between the source region and the drain region, a gate disposed over the channel region, and a heterogeneous pocket disposed near a junction of the source region and the channel region. The heterogeneous pocket comprises a semiconductor material different than the channel region, and the heterogeneous pocket comprises a lower tunneling barrier than a bandgap of the channel region to form a quantum well to increase a current through the TFET transistor when a voltage applied to the gate is above a threshold voltage.

In some embodiments, the junction of the source region and the channel region comprises at least one of silicon (Si), germanium (Ge), silicon germanium (SiGe), indium arsenide (InAs), silicon germanium (Sin), germanium tin (GeSn), or silicon germanium tin (SiGeSn). In some embodiments, the channel region comprises a semiconductor material including indium, and the heterogeneous pocket comprises a semiconductor material having a higher percentage of indium. In some embodiments, a valence band of the source region is aligned with discrete energy levels of the heterogeneous pocket.

In some embodiments, the TFET comprises a nanowire structure that includes the source region, the drain region, the channel region, and the heterogeneous pocket. In some embodiments, the TFET comprises a double gate TFET. In some embodiments, the TFET comprises an n-channel TFET or a p-channel TFET.

Embodiments of the invention describe a system comprising a processor, and a memory communicatively coupled to the processor. At least one of the processor or the memory includes at least one tunneling field effect transistor (TFET) comprising a drain region, a source region having a conductivity type opposite of the drain region, a channel region disposed between the source region and the drain region, a gate disposed over the channel region, and a heterogeneous pocket disposed near a junction of the source region and the channel region. The heterogeneous pocket comprises a semiconductor material different than the channel region, and the heterogeneous pocket comprises a lower tunneling barrier than a bandgap of the channel region to form a quantum well to increase a current through the TFET transistor when a voltage applied to the gate is above a threshold voltage.

In some embodiments, the junction of the source region and the channel region of the TFET comprises at least one of silicon (Si), germanium (Ge), silicon germanium (SiGe), indium arsenide (InAs), silicon germanium (Sin), germanium tin (GeSn), or silicon germanium tin (SiGeSn). In some embodiments, the channel region of the TFET comprises a semiconductor material including indium, and the heterogeneous pocket comprises a semiconductor material having a higher percentage of indium. In some embodiments, a valence band of the source region of the TFET is aligned with discrete energy levels of the heterogeneous pocket.

In some embodiments, the TFET comprises a nanowire structure that includes the source region, the drain region, the channel region, and the heterogeneous pocket. In some embodiments, the TFET comprises a double gate TFET. In some embodiments, the TFET comprises an n-channel TFET or a p-channel TFET.

In some embodiments, the processor and the memory of the above described system comprise discrete components. In other embodiments, the system comprises a system on chip (SoC) architecture, and the processor and the memory are SoC components.

The invention claimed is:

1. A tunneling field effect transistor (TFET) comprising:
a drain region;
a source region having a conductivity type opposite of the drain region, the channel region comprising a semiconductor material the same as the source region;
a channel region disposed between the source region and the drain region; a
gate disposed over the channel region; and
a heterogeneous pocket disposed near a junction of the source region and the channel region, wherein the heterogeneous pocket comprises a semiconductor material different than the channel region, and wherein the heterogeneous pocket comprises a lower tunneling barrier than a bandgap of the channel region to form a quantum well to increase a current through the TFET transistor when a voltage applied to the gate is above a threshold voltage, and wherein the channel region comprises a semiconductor material including indium, and the heterogeneous pocket comprises a semiconductor material having a higher percentage of indium.

2. The TFET of claim 1, wherein the junction of the source region and the channel region comprises at least semiconductor material selected from the group consisting of: silicon (Si), germanium (Ge), silicon germanium (SiGe), indium arsenide (InAs), germanium tin (GeSn), and silicon germanium tin (SiGeSn).

3. The TFET of claim 1, wherein a valence band of the source region is aligned with discrete energy levels of the heterogeneous pocket.

4. The TFET of claim 1, wherein the TFET comprises a nanowire structure that includes the source region, the drain region, the channel region, and the heterogeneous pocket.

5. The TFET of claim 1, wherein the TFET comprises a double gate TFET.

6. The TFET of claim 1, wherein the TFET comprises an n-channel TFET.

7. The TFET of claim 1, wherein the TFET comprises a p-channel TFET.

8. A system comprising:
a processor; and
a memory communicatively coupled to the processor;

wherein at least one of the processor or the memory includes at least one tunneling field effect transistor (TFET) comprising:
a drain region;
a source region having a conductivity type opposite of the drain region;
a channel region disposed between the source region and the drain region, the channel region comprising a semiconductor material the same as the source region;
a gate disposed over the channel region; and
a heterogeneous pocket disposed near a junction of the source region and the channel region, wherein the heterogeneous pocket comprises a semiconductor material different than the channel region, and wherein the heterogeneous pocket comprises a tunneling barrier less than a bandgap of the channel region to form a quantum well in the channel to increase a current through the TFET transistor when a voltage applied to the gate is above a threshold voltage, wherein the channel region of the TFET comprises a semiconductor material including indium, and the heterogeneous pocket comprises a semiconductor material having a higher percentage of indium.

9. The system of claim 8, wherein the junction of the source region and the channel region of the TFET comprises a semiconductor material selected from the group consisting of silicon (Si), germanium (Ge), silicon germanium (SiGe), indium arsenide (InAs), germanium tin (GeSn), and silicon germanium tin (SiGeSn).

10. The system of claim 8, wherein a valence band of the source region of the TFET is aligned with discrete energy levels of the heterogeneous pocket.

11. The system of claim 8, wherein the TFET comprises a nanowire structure that includes the source region, the drain region, the channel region, and the heterogeneous pocket.

12. The system of claim 8, wherein the TFET comprises a double gate TFET.

13. The system of claim 8, wherein the TFET comprises an n-channel TFET.

14. The system of claim 8, wherein the TFET comprises a p-channel TFET.

15. The system of claim 8, wherein the processor and the memory are discrete integrated circuits comprise discrete components.

16. The system of claim 8, wherein the system comprises a system on chip (SoC) architecture, and the processor and the memory are SoC components.

17. A tunneling field effect transistor (TFET) comprising:
a drain region;
a source region having a conductivity type opposite of the drain region;
a channel region disposed between the source region and the drain region;
a gate disposed over the channel region; and
a heterogeneous pocket disposed near a junction of the source region and the channel region, wherein the heterogeneous pocket comprises a semiconductor material different than the channel region and wherein the heterogeneous pocket comprises a lower tunneling barrier than a bandgap of the channel region to form a quantum well to increase a current through the TFET transistor when a voltage applied to the gate is above a threshold voltage, and wherein the channel region comprises a semiconductor material including indium, and the heterogeneous pocket comprises a semiconductor material having a higher percentage of indium.

18. A tunneling field effect transistor (TFET) comprising:
a drain region;
a source region having a conductivity type opposite of the drain region;
a channel region disposed between the source region and the drain region;
a gate disposed over the channel region; and
a heterogeneous pocket disposed near a junction of the source region and the channel region, wherein the heterogeneous pocket comprises a semiconductor material different than the channel region, and wherein the heterogeneous pocket comprises a lower tunneling barrier than a bandgap of the channel region to form a quantum well to increase a current through the TFET transistor when a voltage applied to the gate is above a threshold voltage and wherein a valence band of the source region is aligned with discrete energy levels of the heterogeneous pocket.

19. A system comprising:
a processor; and
a memory communicatively coupled to the processor;
wherein at least one of the processor or the memory includes at least one tunneling field effect transistor (TFET) comprising:
a drain region;
a source region having a conductivity type opposite of the drain region;
a channel region disposed between the source region and the drain region;
a gate disposed over the channel region; and
a heterogeneous pocket disposed near a junction of the source region and the channel region, wherein the heterogeneous pocket comprises a semiconductor material different than the channel region, and wherein the heterogeneous pocket comprises a tunneling barrier less than a bandgap of the channel region to form a quantum well in the channel to increase a current through the TFET transistor when a voltage applied to the gate is above a threshold voltage and wherein the channel region of the TFET comprises a semiconductor material including indium, and the heterogeneous pocket comprises a semiconductor material having a higher percentage of indium.

20. A system comprising:
a processor; and
a memory communicatively coupled to the processor;
wherein at least one of the processor or the memory includes at least one tunneling field effect transistor (TFET) comprising:
a drain region;
a source region having a conductivity type opposite of the drain region;
a channel region disposed between the source region and the drain region;
a gate disposed over the channel region; and
a heterogeneous pocket disposed near a junction of the source region and the channel region, wherein the heterogeneous pocket comprises a semiconductor material different than the channel region, and wherein the heterogeneous pocket comprises a tunneling barrier less than a bandgap of the channel region to form a quantum well in the channel to increase a current through the TFET transistor when a voltage applied to the gate is above a threshold voltage and wherein a valence band of the source region of the TFET is aligned with discrete energy levels of the heterogeneous pocket.

* * * * *